(12) United States Patent
Naito et al.

(10) Patent No.: US 11,942,575 B2
(45) Date of Patent: Mar. 26, 2024

(54) TRANSPARENT ELECTRODE, METHOD OF PRODUCING TRANSPARENT ELECTRODE, AND ELECTRONIC DEVICE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Katsuyuki Naito, Tokyo (JP); Naomi Shida, Tokyo (JP); Yutaka Saita, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 17/682,897

(22) Filed: Feb. 28, 2022

(65) Prior Publication Data

US 2022/0181524 A1 Jun. 9, 2022

Related U.S. Application Data

(63) Continuation of application No. PCT/JP2020/034042, filed on Sep. 9, 2020.

(51) Int. Cl.
  *H01L 33/42* (2010.01)
  *H01L 31/0224* (2006.01)
  *H01L 31/18* (2006.01)

(52) U.S. Cl.
  CPC ...... *H01L 33/42* (2013.01); *H01L 31/022475* (2013.01); *H01L 31/1884* (2013.01)

(58) Field of Classification Search
  CPC ......... H01L 31/1884; H01L 31/022475; H01L 31/42
  See application file for complete search history.

(56) References Cited

U.S. PATENT DOCUMENTS 9,425,344 B2    8/2016   Brohan et al.
10,431,702 B2   10/2019  Shida et al.
(Continued)

FOREIGN PATENT DOCUMENTS

CN    105038222 A    11/2015
CN    109564797 A    4/2019
(Continued)

OTHER PUBLICATIONS

Yu et al., WO 2018034411 A1, English Machine Translation, pp. 1-41. (Year: 2018).*

*Primary Examiner* — Tae-Sik Kang
(74) *Attorney, Agent, or Firm* — Foley & Lardner LLP (57) ABSTRACT

The embodiment provides a transparent electrode having low resistance and high stability against impurities such as halogen and sulfur, a method of producing the transparent electrode, and an electronic device using the transparent electrode. A transparent electrode according to an embodiment includes a transparent substrate and a plurality of conductive regions disposed on a surface of the transparent substrate and separated from each other by a separation region, wherein the conductive region has a structure in which a first transparent conductive metal oxide layer, a metal layer, and a second transparent conductive metal oxide layer are laminated in this order from the substrate side, and in the separation region, there is disposed a trapping material. This transparent electrode can be produced by scribing the conductive region to form a separation region, and then using a halide or a sulfur compound.

19 Claims, 4 Drawing Sheets

(56) References Cited

U.S. PATENT DOCUMENTS

| | | | |
|---|---|---|---|
| 11,180,585 B2 | 11/2021 | Yu et al. | |
| 2003/0180575 A1* | 9/2003 | Ise | H10K 85/655 |
| | | | 428/690 |
| 2015/0130726 A1* | 5/2015 | Min | G06F 3/0443 |
| | | | 345/173 |
| 2019/0027622 A1* | 1/2019 | Shida | H01L 31/022425 |

FOREIGN PATENT DOCUMENTS

| | | | |
|---|---|---|---|
| JP | 2014-532025 A | 12/2014 | |
| JP | 2017-135379 A | 8/2017 | |
| JP | 2019-021599 A | 2/2019 | |
| KR | 10-2018-0020624 A | 2/2018 | |
| KR | 10-2018-0098019 A | 9/2018 | |
| WO | WO-2018034411 A1 * | 2/2018 | B32B 23/08 |

* cited by examiner

TRANSPARENT ELECTRODE, METHOD OF PRODUCING TRANSPARENT ELECTRODE, AND ELECTRONIC DEVICE

CROSS REFERENCE TO RELATED APPLICATIONS

This application is based upon and claims the benefit of priority from the prior International Patent Application PCT/JP2020/034042, filed on Sep. 9, 2020, the entire contents of which are incorporated herein by reference.

FIELD

Embodiments relate to a transparent electrode, a method of producing the transparent electrode, and an electronic device.

BACKGROUND

In recent years, energy consumption has been increasing, and there is an increasing demand for alternative energy to replace conventional fossil energy as a global warming countermeasure. Attention has been focused on a solar cell as a source of such alternative energy, and development of the solar cell has been in progress. Use of the solar cell for various applications has been investigated; however, flexibility and durability of the solar cell are particularly important in order to cope with various installation places. The most basic monocrystalline silicon-based solar cell is expensive and difficult to be made flexible, and organic solar cells and organic-inorganic hybrid solar cells that have recently attracted attention have room for improvement in terms of durability.

In addition to such a solar cell, photoelectric conversion elements such as an organic EL element and an optical sensor have been investigated for the purpose of flexibility and durability improvement. In such an element, an indium-doped tin (ITO) film is widely used as a transparent electrode. The ITO film is typically formed by sputtering or the like, and in order to achieve high conductivity, sputtering at a high temperature or high-temperature annealing after sputtering is required, and the ITO film is often inapplicable to an element including an organic material.

ITO/Ag/ITO having low resistance and high transparency may be used as a transparent electrode. There is an investigation example in which such an electrode is used for an element having a PEDOT/PSS layer, and amorphous ITO (hereinafter, sometimes referred to as a-ITO) and silver used for an ITO film are deteriorated by an acid and a halogen, whereby the performance of the electrode is strongly tended to be deteriorated. Furthermore, oxygen, hydrogen sulfide, and the like in the atmosphere cause deterioration of the transparent electrode, and it is desired to improve stability by suppressing the influence thereof.

DETAILED DESCRIPTION

A transparent electrode according to an embodiment includes a transparent substrate and a plurality of conductive regions disposed on a surface of the transparent substrate and separated from each other by a separation region, wherein
  said conductive region has a structure in which a first transparent conductive metal oxide layer, a metal layer, and a second transparent conductive metal oxide layer are laminated in this order from said substrate side, and
  in said separation region, there is disposed a trapping material that traps any one or more of halogen, sulfur, or oxygen.

In addition, a method of producing a transparent electrode according to an embodiment includes:
  (a) a step of preparing a transparent substrate:
  (b) a step of forming a laminate, including:
    (b1) a step of forming a first transparent conductive metal oxide layer on said transparent substrate;
    (b2) a step of forming a metal layer on said first transparent conductive metal oxide layer; and
    (b3) a step of forming a second transparent conductive metal oxide layer on said metal layer;
  (c) a step of patterning said laminate to form a separation region to form a plurality of conductive regions; and
  (d) a step of disposing, in said separation region, a trapping material that traps any one or more of halogen, sulfur, or oxygen.

In addition, the electronic device according to the embodiment has a structure in which said transparent electrode, an active layer, and a counter electrode are laminated in this order.

Embodiments will now be explained with reference to the accompanying drawings.

Embodiment 1

Figure 1:
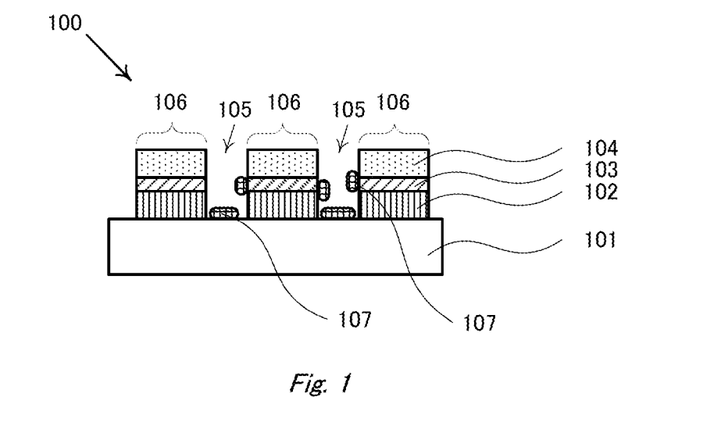
FIG. 1 is a conceptual view showing a structure of a transparent electrode according to an embodiment.

FIG. 1 is a schematic configuration view of a transparent electrode 100 according to the present embodiment. This transparent electrode includes a plurality of conductive regions 106 on a transparent substrate 101, and the plurality of conductive regions 106 are separated from each other by a separation region 105.

The conductive region 106 includes a first transparent conductive metal oxide layer (hereinafter, sometimes referred to as a first oxide layer) 102, a metal layer 103, and a second transparent conductive oxide (hereinafter, sometimes referred to as a second oxide layer) in this order from the substrate side.

In an embodiment, a trapping material 107 is disposed in the separation region. As illustrated in FIG. 1, in one aspect, this trapping material is disposed at the bottom of the separation region or near the side surface of the metal layer 103 exposed to the separation region. In addition, the separation region may be filled with a trapping material.

A second oxide layer 104 has effects of suppressing migration of a metal such as silver from the metal layer 103 to the active layer formed on the transparent electrode and suppressing migration of halogen ions and the like from the active layer to the metal electrode.

Hereinafter, the configuration of the transparent electrode according to the first embodiment will be described in detail.

An inorganic material such as glass, and an organic material such as polyethylene terephthalate (hereinafter, referred to as PET), polyethylene naphthalate (hereinafter, referred to as PEN), polycarbonate, and PMMA are used as a material of the transparent substrate 101. Use of a flexible organic material is preferable because the photoelectric conversion element according to the embodiment has high flexibility. In addition, the transparent substrate is preferably subjected to a flattening treatment in order to provide light transmissivity and suppress occurrence of defects during the production.

The material of the first oxide layer 102 can be selected from any widely known materials. Specific examples thereof include indium-doped tin oxide (ITO: indium doped tin oxide), fluorine-doped tin oxide (FTO: fluorine doped tin oxide), aluminum-doped zinc oxide (AZO: aluminium doped zinc oxide), and indium-doped zinc oxide (IZO: indium doped zinc oxide), and the like. The above metal oxide contains an amorphous structure, and the film thickness is preferably 30 to 200 nm, more preferably 35 to 100 nm, and still more preferably 40 to 70 nm. The amorphous structure easily forms a continuous, uniform, and flat film. An excessively small film thickness tends to increase the resistance, and an excessively large film thickness decreases the transparency, taking time to form the film. Of the above materials, ITO is preferable because the zeta potential is close to 0 at a neutral pH and the interaction with cations or anions is small.

Examples of the material of the metal layer 103 include silver, copper, gold, stainless steel, titanium, nickel, chromium, tungsten, molybdenum, tin, zinc, and alloys thereof, and silver, copper, and alloys thereof are preferable. The thickness of the metal layer 103 is preferably 4 to 20 nm, more preferably 5 to 15 nm, still more preferably 6 to 10 nm. An excessively small film thickness tends to increase the resistance, and an excessively large film thickness tends to decrease the transparency. Silver tends to migrate easily; however, is excellent in conductivity, and copper has higher migration resistance than silver and is cheaper; however, has lower conductivity. Combining these in a well-balanced manner can achieve both conductivity and the effect of migration suppression.

The material of the second oxide layer 104 can be selected from the same materials as those listed for the first oxide layer. The same material is preferably used for the first oxide layer 102 and the second oxide layer 104. The thickness of the second oxide layer is preferably 5 to 50 nm, more preferably 10 to 40 nm, and still more preferably 15 to 30 nm. An excessively small film thickness tends to deteriorate the function of preventing migration of metal. An excessively large film thickness tends to increase the resistance, thereby hardly transferring charge. The second oxide layer 104 has an effect of suppressing migration, and the effect is significant when the oxide layer is continuous. Whether the oxide layer is continuous or not can be evaluated by cross-sectional SEM. Cross-sectional SEM can be measured at a magnification of 100000. The number of discontinuous portions measured in 10 sheets of cross-sectional SEM at different positions is preferably 2 or less, and more preferably 0.

The separation region 105 is a high resistance region that exists between the plurality of conductive regions 106 and physically and electrically separates them from each other. This separation region may be a void or may be filled with an insulating material.

In an embodiment, the trapping material 107 is disposed in this separation region. The trapping material 107 reacts with a metal constituting the metal layer, for example, silver or copper to chemically or physically trap an element that lowers the conductivity thereof, for example, halogen, sulfur, or oxygen, thus exhibiting an action of suppressing the decrease in the conductivity of the conductive region 106.

One containing metallic silver and silver halide or a sulfur compound of silver is preferable as a trapping material. These materials easily reduces migration of silver and have a high ability to trap halogen, sulfur, or oxygen. The sulfur compound is preferably a reaction product of silver and an alkyl thiol, or silver sulfide. The sulfur compound of silver is stable, and particularly, silver sulfide is highly stable. The reaction product of silver or copper and an alkyl thiol particularly tends to have a high effect of suppressing oxidation and the like, because the surface of metallic silver or metallic copper is chemically modified with the alkyl thiol.

In the physical scribing, the surface of silver, copper, or an alloy thereof of the laminated electrode comes out at the scribe end and can preferably function as a trapping material. When a potential is applied to the scribe end, electric field concentration easily occurs, and a surface area of silver or copper is increased to easily occur reaction, leading to an effect of reducing the reaction to halogen, sulfur, or oxygen in the conductive region.

In addition, the trapping material may be an insulating inorganic material. The insulating oxide can be selected from zeolite, silicon oxide, and aluminum oxide.

The trapping material preferably has a particulate structure. In addition, the trapping material preferably has a porous structure. The trapping material has these structures, thereby increasing the surface area thereof and tending to increase the trapping effect.

In FIG. 1, the high separation region 105 is a void; however, the separation region 105 may be filled with a material containing a p-type inorganic oxide, an n-type inorganic oxide, a p-type organic compound, or an n-type organic compound. These adsorb halogen, sulfur, or oxygen, or suppress migration, thereby allowing suppressing a decrease in conductivity of the conductive region. The n-type inorganic oxide can be selected from titanium oxide, tin oxide, zinc oxide, and zirconium oxide. Of these, titanium oxide and zirconium oxide are preferable because the film is stable and easily formed, the zeta potential is close to 0 at neutral pH, and the interaction with cations or anions is small. Furthermore, titanium oxide is more preferable from the viewpoint of supplying the raw material. The p-type inorganic oxide can be selected from nickel oxide, molybdenum oxide, iron oxide, and copper oxide. Of these, nickel oxide is preferable because the film is stable and easily produced, the zeta potential is close to 0 at neutral pH, and the interaction with cations or anions is small. The p-type organic molecule is preferably a polymer having a skeleton such as polythiophene or polyaniline. The n-type organic molecule preferably has a fullerene skeleton.

In an embodiment, a graphene layer (not illustrated) is preferably on the second oxide layer. In an embodiment, the graphene layer has a structure in which one to several layers of graphene having a sheet shape are laminated. The number of laminated graphene layers is not particularly limited, and is preferably 1 to 6, and more preferably 2 to 4, in order to allow obtaining sufficient transparency, conductivity, or ion shielding effect.

The graphene preferably has a structure in which, for example, a polyalkyleneimine, particularly a polyethyleneimine chain is bonded to a graphene skeleton as shown in the following formula. In addition, the carbon of the graphene skeleton is preferably partially substituted with nitrogen.

[Chemical Formula 1]

In the above formula, a polyethyleneimine chain is exemplified as a polyalkyleneimine chain. The number of carbon atoms included in the alkyleneimine unit is preferably 2 to 8, and polyethyleneimine including a unit having two carbon atoms is particularly preferable. In addition, there can be used not only the linear polyalkyleneimine but also a polyalkyleneimine having a branched chain or a cyclic structure. Herein, n (the number of repeating units) is preferably 10 to 1000, and more preferably 100 to 300.

The graphene is preferably unsubstituted or nitrogen-doped. Nitrogen-doped graphene is preferable for a negative electrode. The doping amount (N/C atomic ratio) can be measured by an X-ray photoelectron spectrum (XPS), and is preferably 0.1 to 30 atom %, and more preferably 1 to 10 atom %. The graphene-containing layer has a high shielding effect, and thus can prevent diffusion of acid and halogen ions to prevent deterioration of metal oxides and metals, and prevent intrusion of impurities from the outside into the photoelectric conversion layer. Furthermore, the nitrogen-substituted graphene-containing layer (N-graphene-containing layer) includes a nitrogen atom, and therefore the trapping ability against an acid is also high and the shielding effect is higher.

In addition, a metal oxide layer (third oxide layer) may be further provided on the graphene-containing layer or the second oxide layer. The presence of such a layer easily balances conductivity and a function of preventing migration of metal.

The oxide constituting the third oxide layer can be selected from, for example, titanium oxide, tin oxide, zinc oxide, and zirconium oxide. These easily become n-type semiconductors, and are preferable when an electrode is used as a negative electrode. Of these, titanium oxide and zirconium oxide are preferable because the oxide layer is stable and easily formed, the zeta potential is close to 0 at neutral pH, and the interaction with cations or anions is small. Furthermore, titanium oxide is more preferable from the viewpoint of supplying the raw material.

In addition, a layer including a material containing a p-type inorganic oxide, an n-type inorganic oxide, a p-type organic compound, or an n-type organic compound can be provided on the graphene-containing layer. The material that can be used herein can be selected from the same materials as those that can be filled in the separation region described above.

Furthermore, a graphene oxide layer can be formed on the graphene-containing layer. Herein, the graphene oxide included in the graphene oxide-containing layer has a graphene skeleton oxidized, and is preferably unmodified. Laminating such an unmodified graphene oxide containing layer can increase the work function of the transparent electrode or the electronic device including the transparent electrode, and enhance the shielding property against ions.

Each layer described herein may have a structure in which two or more layers are laminated. In this case, the materials and production method of the layers to be laminated may be the same or different.

In an embodiment, a plurality of separation regions having different structures can be provided. For example, when the separation structure is a trench-shaped structure, the width may change continuously or discontinuously. The shape of the transparent electrode is designed according to the intended element structure; however, the shape determined by the element structure may be a shape that is easily deteriorated. For this reason, disposing a separation region having a large area in the vicinity of a portion that is easily deteriorated can increase the trapping ability and suppress deterioration of the element function. In addition, it is possible to suppress deterioration of the conductive region by forming a structure in which the periphery of the conductive region having a shape or a material that is easily deteriorated is surrounded by the separation region.

Embodiment 2

A method of producing a transparent electrode 200 according to the second embodiment will be described below with reference to FIG. 2.

A method of producing the transparent electrode according to the embodiment includes forming a laminate constituting a conductive region on a substrate, and then patterning the laminate to separate the laminate into a plurality of conductive regions.

Figure 2A:
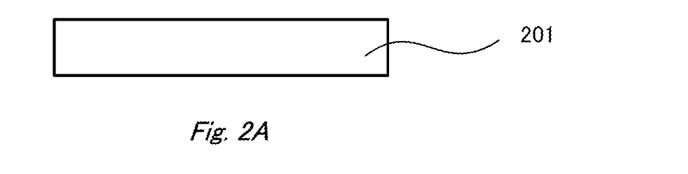
FIGS. 2A to 2D are conceptual views showing a method of producing a transparent electrode according to an embodiment.

A transparent substrate 201 is prepared (step (a), FIG. 2(A)). The transparent substrate 201 is preferably smooth, and can be subjected to smoothness treatment by polishing or the like and corona treatment prior to the production of the transparent substrate.

Figure 2B:
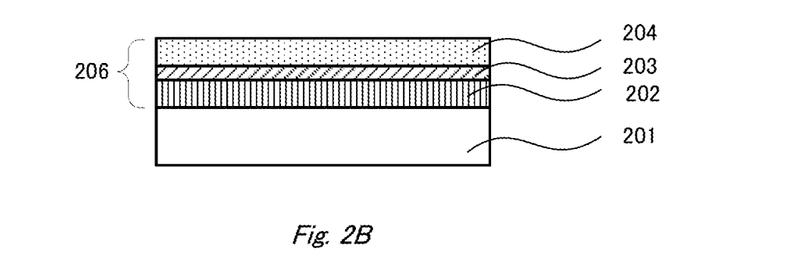

Then, a laminate constituting the conductive region is formed on the transparent substrate (step (b), FIG. 2(B)). The step (b) includes element steps in the following order:

(b1) a step of forming a first transparent conductive metal oxide layer 202 on the transparent substrate 201;

(b2) a step of forming a metal layer 203 on the first transparent conductive metal oxide layer 202; and (b3) a step of forming a second transparent conductive metal oxide layer 204 on the metal layer 203.

In the step (b1), the first oxide layer 202 is formed. The first oxide layer 202 can be formed, for example, by sputtering at a low temperature. The amorphous inorganic oxide layer can be formed by low-temperature sputtering, and the amorphous inorganic oxide can be partially crystallized by annealing to be formed into a mixture. Annealing is preferably performed in a high-temperature atmosphere or by laser annealing. The first oxide layer 202 is formed uniformly, that is, as an unpatterned uniform film on the substrate 201.

In the step (b2), the metal film 203 is formed. The metal layer 103 can be formed by, for example, sputtering or vapor deposition, and sputtering is preferable. This metal layer 203 is formed as a uniform film on the first oxide layer 202.

Then, in the step (b3), the second oxide layer 204 is formed. The second oxide layer can also be produced by a method selected from the same methods as those described for the first oxide layer. The materials and methods used may be the same as or different from those of the first oxide layer.

It has been described that the production can be mainly performed by sputtering in the steps (b1) to (b3), the method is not particularly limited, and the formation can be performed by an optional method.

As necessary, a graphene-containing layer can also be formed on the second oxide layer 204 in the step (b4) after the step (b3).

The graphene-containing layer can be formed by an optional method, and is preferably formed by a coating method. According to the coating method, the electrode can be easily produced although the substrate 201 or the second oxide layer 204 has a large area.

Typically, a graphene-containing layer can be obtained by applying onto the second oxide layer 204 and, as necessary, drying a dispersion liquid in which graphene is dispersed in a dispersion medium. The graphene used herein may be unsubstituted or unmodified graphene, N-graphene in which carbon of a graphene skeleton is substituted with nitrogen, or modified graphene in which an alkyleneimine chain is bonded to a graphene skeleton. In addition, the graphene-containing layer can be formed by temporarily forming a graphene oxide-containing layer by using graphene oxide substituted with an alkyl chain or the like as graphene, and by reducing the graphene oxide by applying a hydrazine compound or an amine compound, for example, hydrated hydrazine, to the formed graphene oxide-containing layer.

Water, alcohols, dimethylformamide, methyl ethyl ketone, chlorbenzene, or a mixture thereof and a wide range of solvents are used as the dispersion medium included in the dispersion liquid containing graphene or the like. Of these, water is the most environmentally preferable and inexpensive.

The graphene-containing layer can also be formed by a method:
(i) forming an N-graphene-containing layer on the surface of the laminate by a chemical vapor deposition method with combining a low-molecular nitrogen compound such as ammonia, pyridine, methylamine, ethylenediamine, or urea in addition to a basic raw material such as methane or hydrogen;
(ii) forming the graphene-containing layer on another substrate and then transferring it onto the laminate; or
(iii) forming an unsubstituted graphene film on the surface of the laminate and then perform the treatment in nitrogen plasma to perform the production.

As necessary, the other layer can be formed before and after the step (b) or between the steps (b1) to (b4). Particularly, after the step (b4), a step (step (b5)) of forming a graphene oxide containing layer on the graphene-containing layer can also be added. For example, the graphene-oxide aqueous dispersion liquid, by which the graphene-oxide dispersion liquid can be applied onto the graphene-containing layer, has high affinity with the underlying graphene-containing layer, and therefore a uniform film is easily formed. The graphene oxide may be dispersed in an organic solvent such as methanol or ethanol to be applied.

In addition, a step of forming a third oxide layer on the graphene-containing layer (step (b5')) can be added after the step (b4) as necessary.

The third oxide layer can be formed by various methods such as a sputtering method and a sol-gel method, and the formation is preferably performed by applying an alcohol solution of a metal alkoxide and then performing a heat treatment in a water-containing atmosphere because a thin and uniform amorphous film having a large area can be formed.

Both the step (b5) and step (b5') can be added, and in this case, any of these steps may be performed previously.

In addition, the first transparent conductive metal oxide layer, the metal layer, the second transparent conductive metal oxide layer, the graphene-containing layer, and the graphene oxide-containing layer can be produced in two or more stages, respectively. In this case, the materials and methods used in the respective stages may be the same or different.

Figure 2C:
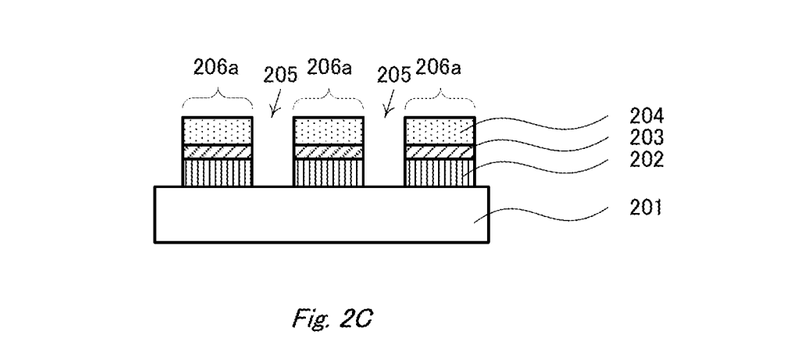

The laminate 206 is formed in this manner, and then the laminate is separated by patterning to form a plurality of conductive regions 206a (step (c), FIG. 2(C)). A portion where the laminate is removed by patterning becomes a separation region 205.

The patterning can be performed by an optional method, and mechanical scribing, laser scribing, or etching is preferably used. Of these, using mechanical scribing or laser scribing often causes the metal material to be particulate and to adhere to the separation region when the metal layer 203 is processed. This particulate metal can be used as a raw material of a trapping material as it is, and therefore a transparent electrode can be formed more efficiently.

Figure 2D:
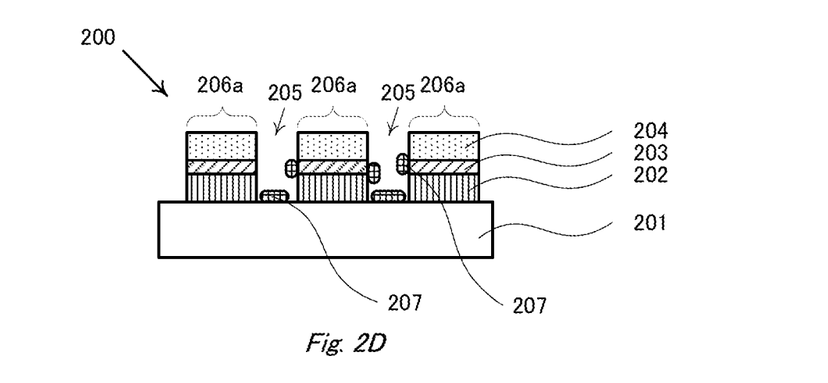

Then, a trapping material is disposed in the separation region 205 formed in the step (C) (step (D)). The trapping material may be formed independently and then disposed in the separation region, or may be formed by reacting a raw material of the trapping material in the separation region. Particularly, when scribing is performed in the step (C), metal particles derived from the metal layer 203 constituting the laminate may remain in the separation region. In such a case, introducing a halide or a sulfur compound is introduced in the separation region to react with the metal particles. This forms, in the separation region, a trapping material including a metal such as silver and a metal halide or sulfur compound such as silver halide or the sulfur compound of silver. In addition, the side surface of the metal layer 203 is exposed in the separation region, and therefore a trapping material is also formed in this portion.

In addition, the trapping material can be disposed in the separation region by independently forming a trapping material including a metal and a halide or sulfur compound of the metal, and by applying and drying the dispersion liquid thereof. In addition, a particulate trapping material may be dispersed in a semiconductor material or the like, and the dispersion thereof may be filled in the separation region. Furthermore, the separation region can be filled with an insulating inorganic material that is a trapping material as it is.

The trapping material may be disposed not only in the separation region but also on the upper surface of the laminate. Such a configuration can further reduce the influence of oxygen, halogen, or sulfur.

Embodiment 3-1

Figure 3:
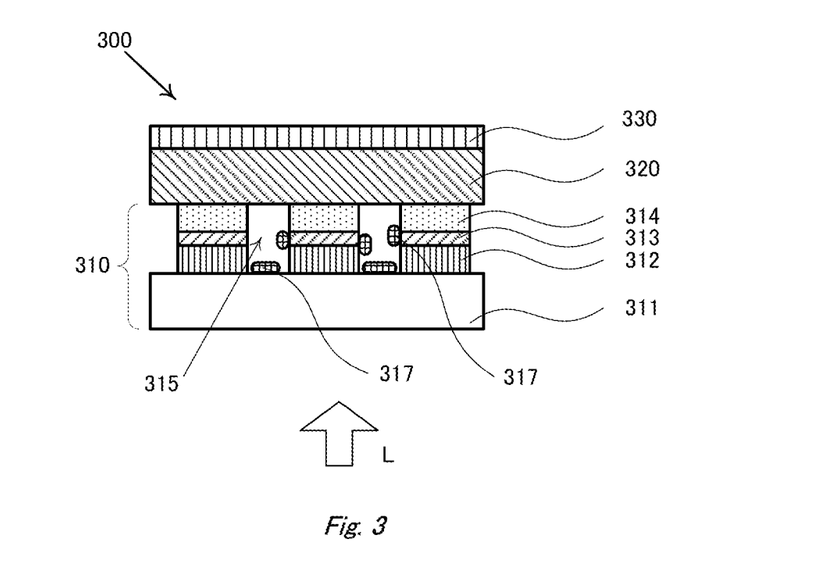
FIG. 3 is a conceptual view showing a structure of a photoelectric conversion element (solar battery cell) according to an embodiment.

A configuration of the electronic device according to one of the third embodiments will be described with reference to FIG. 3. FIG. 3 is a schematic configuration view of a photoelectric conversion element (solar battery cell) 300 that is an example of the electronic device according to the present embodiment. The solar battery cell 300 is an element having a function as a solar battery that converts light energy such as the sunlight L incident on the cell into electric power. The solar battery cell 300 includes a transparent electrode 310 according to the embodiment, a counter electrode 330, and a photoelectric conversion layer 320 provided therebetween.

Herein, the transparent electrode 310 corresponds to the first embodiment, and has a plurality of conductive regions having a structure in which a transparent substrate 311, a first transparent conductive metal oxide layer 312, a metal layer 313, and a second transparent conductive metal oxide layer 314 are laminated, and there is a separation region 315 therebetween. A trapping material 317 is disposed in the separation region 315.

The photoelectric conversion layer 320 is a semiconductor layer that converts light energy of incident light into electric power to generate a current. The photoelectric conversion layer 320 generally includes a p-type semiconductor layer and an n-type semiconductor layer. There can be used, as the photoelectric conversion layer, a laminate of a p-type polymer and an n-type material, $RNH_3PbX_3$ (X represents a halogen ion, R represents an alkyl group and the like), a silicon semiconductor, an inorganic compound semiconductor such as InGaAs, GaAs, chalcopyrite, CdTe, InP, SiGe, or Cu2O, a quantum dot-containing transparent semiconductor, and a dye-sensitized transparent semiconductor. In any case, the efficiency is high, and the reduction of the output is small by providing the transparent electrode according to the embodiment.

A buffer layer may be inserted between the photoelectric conversion layer 320 and the transparent electrode 310 to promote or block charge injection. In addition, another charge buffer layer or charge transport layer may be inserted between the counter electrode 330 and the photoelectric conversion layer 320.

There can be used, as the buffer layer or the charge transport layer for a positive electrode, for example, a layer composed of vanadium oxide, PEDOT/PSS, a p-type polymer, vanadium pentoxide ($V_2O_5$), 2,2',7,7'-tetrakis[N,N-di (4-methoxyphenyl)amino]-9, 9'-spirobifluorene (hereinafter, referred to as Spiro-OMeTAD), nickel oxide (NiO), tungsten trioxide ($WO_3$), or molybdenum trioxide ($MoO_3$).

Whereas, there can be used, as the buffer layer or the charge transport layer for a transparent electrode serving as a negative electrode, a layer composed of lithium fluoride (LiF), calcium (Ca), 6,6'-phenyl-C61-butyl acid methyl ester (6,6'-phenyl-C61-butyric acid methyl ester, C60-PCBM), 6,6'-phenyl-C 71-butyl acid methyl ester (6,6'-phenyl-C71-butyric acid methyl ester, hereinafter referred to as C70-PCBM), indene-C60 bis-adduct (hereinafter referred to as ICBA), cesium carbonate ($Cs_2CO_3$), titanium dioxide (TiO2), poly[(9,9-bis(3'-(N,N-dimethylamino)propyl)-2,7-fluorene)-alt-2,7-(9,9-dioctyl-fluorene)] (hereinafter, referred to as PFN), Bathocuproine (hereinafter referred to as BCP), zirconium oxide (ZrO), zinc oxide (ZnO), or polyethynimine.

A brookite-type titanium oxide layer can be provided between the photoelectric conversion layer and the transparent electrode. It is known that titanium oxide has three types of crystal structures of a rutile type, an anatase type, and a brookite type. In the embodiment, it is preferable to use a layer including brookite-type titanium oxide of these. This brookite-type titanium oxide layer exhibits an effect of suppressing movement of halogen from the photoelectric conversion layer to the conductive layer and movement of metal ions from the conductive layer to the photoelectric conversion layer. Therefore, the life of the electrode and the electronic device can be prolonged. Such a brookite-type titanium oxide layer is preferably composed of nanoparticles of brookite-type titanium oxide, specifically, particles having an average particle size of 5 to 30 nm. Herein, the average particle size has been measured by a particle size distribution measuring apparatus. Such brookite-type nanoparticles are commercially available, for example, from Kojundo Chemical Laboratory Co., Ltd.

An optional electrode can be used, and the transparent electrode according to the embodiment can also be used as the counter electrode 330. An opaque metal electrode is widely used. There is used, as a material of such a metal electrode, stainless steel, copper, titanium, nickel, chromium, tungsten, gold, silver, molybdenum, tin, or zinc.

In addition, the counter electrode 330 may contain unsubstituted planar monolayer graphene. The unsubstituted monolayer graphene can be formed by a CVD method in which a copper foil is used as a base catalyst layer and methane, hydrogen, or argon as a reaction gas. For example, a thermal transfer film and monolayer graphene are pressure-bonded, then copper is dissolved, and the monolayer graphene is transferred onto the thermal transfer film. Repeating the same operation can laminate a plurality of monolayer graphene on the thermal transfer film, and 2 to 4 layers of graphene layers are formed. A metal wiring for current collection is printed on this film by using a silver paste or the like, whereby a counter electrode can be formed. Instead of unsubstituted graphene, graphene in which a part of carbon is substituted with boron may be used. Boron-substituted graphene can be formed in the same manner by using $BH_3$, methane, hydrogen, or argon as a reaction gas. These graphenes can also be transferred from a thermal transfer film onto a suitable substrate such as PET.

In addition, these monolayer or multilayer graphenes may be doped with a tertiary amine as an electron donor molecule. An electrode composed of such a graphene layer also functions as a transparent electrode.

The solar battery cell according to the embodiment may have a structure in which both surfaces are sandwiched between transparent electrodes.

The solar battery cell having such a structure can efficiently utilize light from both surfaces. The energy conversion efficiency is generally 5% or more, and the electrode substrate composed of a transparent polymer provides long-term stability and flexibility.

In addition, a glass transparent electrode having a metal oxide layer such as ITO can be used as the counter electrode 330. In this case, flexibility of the solar battery cell is sacrificed; however, light energy can be used with high efficiency.

The solar battery cell can further include an ultraviolet cut layer, a gas barrier layer, and the like. Whereas, there can be used, as the buffer layer or the charge transport layer for a transparent electrode serving as a negative electrode, a layer composed of lithium fluoride (LiF), calcium (Ca), 6,6'-phenyl-C61-butyl acid methyl ester (6,6'-phenyl-C61-butyric acid methyl ester, C60-PCBM), 6,6'-phenyl-C 71-butyl acid methyl ester (6,6'-phenyl-C71-butyric acid methyl ester, hereinafter referred to as C70-PCBM), indene-C60 bis-adduct (hereinafter referred to as ICBA), cesium carbonate ($Cs_2CO_3$), titanium dioxide (TiO2), poly[(9,9-bis(3'-(N,N-dimethylamino)propyl)-2,7-fluorene)-alt-2,7-(9,9-dioctyl-fluorene)] (hereinafter, referred to as PFN), Bathocuproine (hereinafter referred to as BCP), zirconium oxide (ZrO), zinc oxide (ZnO), or polyethynimine. These compounds desirably cut ultraviolet rays having 400 nm or less.

The gas barrier layer blocking particularly water vapor and oxygen is preferable, and a gas barrier layer that hardly passes water vapor is particularly preferable. For example, a layer composed of an inorganic material of SiN, $SiO_2$, SiC, $SiO_xN_y$, $TiO_2$, or $Al_2O_3$, ultra-thin glass, or the like can be preferably used. The thickness of the gas barrier layer is not particularly limited, and is preferably in the range of 0.01 to 3000 μm, and more preferably in the range of 0.1 to 100 μm. Sufficient gas barrier properties tend not to be obtained at less than 0.01 μm, and whereas, characteristics such as flexibility and softness tend to disappear due to an increase in thickness at more than 3000 μm. The water vapor transmission amount (moisture permeability) of the gas barrier layer is preferably $10^2$ g/m²·d to $10^{-6}$ g/m²·d, more preferably 10 g/m²·d to $10^{-5}$ g/m²·d, and still more preferably 1 g/m²·d to $10^{-4}$ g/m²·d. The moisture permeability can be measured in accordance with ES 20208 or the like. A dry method is preferable for forming a gas barrier layer. Examples of a method of forming a gas barrier layer having a gas barrier property by a dry method include: vacuum vapor deposition methods such as a resistance heating vapor deposition, an electron beam vapor deposition, an induction heating vapor deposition, and an assist method using a plasma or an ion beam; sputtering methods such as a reactive sputtering method, an ion beam sputtering method, or an electron cyclotron (ECR) sputtering method; a physical vapor deposition method (PVD method) such as an ion plating method; and a chemical vapor deposition method (CVD method) using heat, light, plasma, or the like. Of these, there is preferable the vacuum vapor deposition method in which a layer is formed by a vapor deposition method under vacuum.

The transparent electrode according to the embodiment includes a substrate. However, after the production of a transparent substrate, the transparent substrate can be removed as necessary. Specifically, in the production process of the electronic device, the transparent substrate and the photoelectric conversion layer formed thereon are integrated, and then the substrate can be peeled off and removed. In such a case, the substrate is a support for forming the electrode structure, and therefore does not need to be transparent, and metal, an opaque resin material, or the like can be used.

The solar battery cell of the present embodiment can also be used as a photosensor.

Embodiment 3-2

Figure 4:
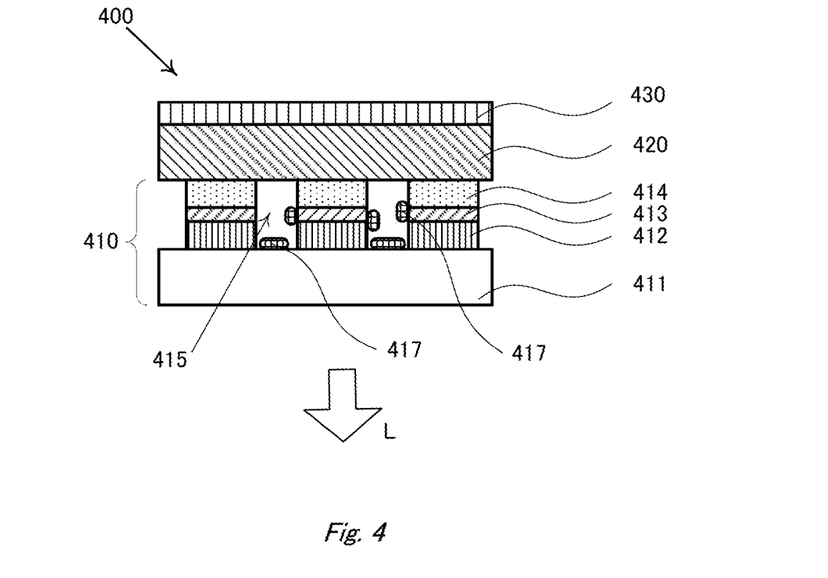
FIG. 4 is a conceptual view showing a structure of a photoelectric conversion element (organic EL element) according to an embodiment.

FIG. 4 is a schematic configuration view of an organic EL element 400 according to the third different embodiment. The organic EL element 400 is an element having a function as a light emitting element that converts electric energy input to this element into light L. The organic EL element 400 includes a transparent electrode 410 according to the embodiment, a counter electrode 430, and a photoelectric conversion layer (light emitting layer) 420 provided therebetween.

Herein, the transparent electrode 410 corresponds to the first embodiment 1, and has a plurality of conductive regions having a structure in which a transparent substrate 411, a first transparent conductive metal oxide layer 412, a metal layer 413, and a second transparent conductive metal oxide layer 414 are laminated, and there is a separation region 415 therebetween. A trapping material 417 is disposed in the separation region 415.

The photoelectric conversion layer 420 is a layer that recombines the charge injected from the transparent electrode 410 and the charge injected from the counter electrode 430 to convert electric energy into light. The photoelectric conversion layer 420 generally includes a p-type semiconductor layer and an n-type semiconductor layer, and optional materials having a photoelectric conversion function can be used. A buffer layer may be provided between the photoelectric conversion layer 420 and the counter electrode 430 to promote or block charge injection, and another buffer layer may also be provided between the photoelectric conversion layer 420 and the transparent electrode. The counter electrode 430 is typically a metal electrode; however, a transparent electrode may be used.

EXAMPLES

Example 1

Figure 5:
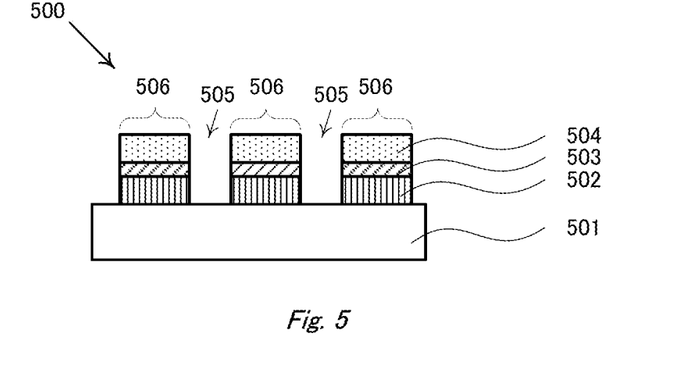
FIG. 5 is a conceptual view showing a structure of a transparent electrode of Example 1.

A transparent electrode 500 having the structure shown in FIG. 5 is produced. A laminated structure of an amorphous ITO (a-ITO) layer 502 (45 to 52 nm), an alloy layer 503 including silver and palladium (5 to 8 nm), and an a-ITO layer 504 (45 to 52 nm) is formed on a PET film 501 having a thickness of 100 μm by a sputtering method. The surface resistance of the laminated structure is 7 to 10Ω/□. Then, separation regions 505 having a width of about 70 μm are formed at intervals of 13 mm by mechanical scribing, and a plurality of conductive regions 506 are formed. In the microscopic observation, particulate silver alloys are scattered in the separation region. In addition, a surface of the silver alloy protruded from a side surface of the laminated electrode. This transparent electrode is immersed in 3% salt water, and a potential is applied at +0.5 V (silver-silver chloride electrode) for 10 minutes. When the sheet resistance after water washing is measured, the increase in resistance is 10% or less. In addition, when observed with a microscope, white silver chloride is observed to be generated on the surface of the scribe end, and particulate white silver chloride is observed in the separation region. This silver chloride and silver as a reaction raw material thereof (a particulate silver alloy and a metal layer exposed to the side surface) constituted the trapping material 507.

Example 2

A laminated electrode is produced in the same manner as in Example 1. Then, separation regions having a width of about 40 μm are produced at intervals of 13 mm by laser scribing. This transparent electrode is immersed in 3% salt water, and a potential is applied at +0.5 V (silver-silver chloride electrode) for 10 minutes. When the sheet resistance after water washing is measured, the increase in resistance is 16% or less. In addition, when observed with a microscope, white silver chloride is observed to be generated on the surface of the scribe end surface.

Comparative Example 1

A potential is applied in salt water in the same manner as in Example 1, except that the transparent electrode of Example 1 is not scribed. The increase in sheet resistance is 20% or more.

Example 3

A laminated structure of an a-ITO layer (45 to 52 nm), a metallic silver layer (5 to 8 nm), and an a-ITO layer (45 to 52 nm) is formed on a PET film 11 having a thickness of 100 µm by a sputtering method. The surface resistance is 6 to 9Ω/□. Then, separation regions having a width of about 40 µm are produced at intervals of 13 mm by laser scribing. Then, exposure to hydrogen sulfide gas is performed for 30 seconds. This transparent electrode is immersed in 3% salt water, and a potential is applied at +0.5 V (silver-silver chloride electrode) for 10 minutes. When the sheet resistance after water washing is measured, the increase in resistance is 10% or less. In addition, when observed with a microscope, white silver chloride is observed to be generated on the surface of the scribe end surface.

Comparative Example 2

A potential is applied in salt water in the same manner as in Example 3, except that the transparent electrode of Example 3 is not scribed. The increase in sheet resistance is 50% or more.

Example 4

In the same manner as in Example 1, a laminated structure of an a-ITO layer, an alloy layer including silver and palladium, and an a-ITO layer is formed on a PET film having a thickness of 100 µm by a sputtering method. The surface resistance is 8 to 10Ω/□. There is formed thereon a barrier layer in which average four layers of N-graphene films with a part of carbon atoms substituted with nitrogen atoms are laminated.

The barrier layer is formed as follows. The surface of the Cu foil is heat-treated by laser irradiation, and the crystal grains are enlarged by annealing. Whereas, there can be used, as the buffer layer or the charge transport layer for a transparent electrode serving as a negative electrode, a layer composed of lithium fluoride (LiF), calcium (Ca), 6,6'-phenyl-C61-butyl acid methyl ester (6,6'-phenyl-C61-butyric acid methyl ester, C60-PCBM), 6,6'-phenyl-C 71-butyl acid methyl ester (6,6'-phenyl-C71-butyric acid methyl ester, hereinafter referred to as C70-PCBM), indene-C60 bis-adduct (hereinafter referred to as ICBA), cesium carbonate ($Cs_2CO_3$), titanium dioxide (TiO2), poly[(9,9-bis(3'-(N,N-dimethylamino)propyl)-2,7-fluorene)-alt-2,7-(9,9-dioctyl-fluorene)] (hereinafter, referred to as PFN), Bathocuproine (hereinafter referred to as BCP), zirconium oxide (ZrO), zinc oxide (ZnO), or polyethynimine. In this case, a monolayer graphene layer is formed in most portions, and a portion with two or more layers of N-graphene laminated is also generated depending on conditions; however, the portion is conveniently referred to as a monolayer graphene layer. Furthermore, treatment is performed at 1000° C. for 5 minutes under an ammonia/argon mixed gas stream, and then cooling is performed under an argon stream. The monolayer N-graphene layer is transferred onto the thermal transfer film by pressure-bonding the thermal transfer film (150 µm thick) and the monolayer N-graphene and then immersing in an ammonia alkaline cupric chloride etchant in order to dissolve Cu. Repeating the same operation laminated four layers of the monolayer graphene layers on the thermal transfer film to provide a multilayer N-graphene layer.

The thermal transfer film is laminated on the prepared laminated structure, and then the N-graphene layer is transferred onto the laminated structure by heating to form the barrier layer 505.

The nitrogen content of the barrier layer (graphene-containing layer) measured by XPS is 1 to 2 atm % under this condition. The ratio between carbon atoms and oxygen atoms of the carbon material measured by XPS is 100 to 200.

Then, conductive regions separated by separation regions having a width of about 70 µm are formed at intervals of 13 mm by mechanical scribing. In the microscopic observation, particulate silver alloys are scattered in the separation region. This transparent electrode is immersed in 3% salt water, and a potential is applied at +0.5 V (silver-silver chloride electrode) for 10 minutes. When the sheet resistance after water washing is measured, the increase in resistance is 5% or less. In addition, when observed with a microscope, white silver chloride is observed to be generated on the surface of the scribe end, and particulate white silver chloride is observed in the separation region.

Example 5

In the same manner as in Example 1, a laminated structure of an a-ITO layer, an alloy layer including silver and palladium, and an a-ITO layer is formed on a PET film having a thickness of 100 µm by a sputtering method. The surface resistance is 8 to 10Ω/□. Then, separation regions having a width of about 40 µm are produced at intervals of 13 mm by laser scribing.

Whereas, there can be used, as the buffer layer or the charge transport layer for a transparent electrode serving as a negative electrode, a layer composed of lithium fluoride (LiF), calcium (Ca), 6,6'-phenyl-C61-butyl acid methyl ester (6,6'-phenyl-C61-butyric acid methyl ester, C60-PCBM), 6,6'-phenyl-C 71-butyl acid methyl ester (6,6'-phenyl-C71-butyric acid methyl ester, hereinafter referred to as C70-PCBM), indene-C60 bis-adduct (hereinafter referred to as ICBA), cesium carbonate ($Cs_2CO_3$), titanium dioxide (TiO2), poly[(9,9-bis(3'-(N,N-dimethylamino)propyl)-2,7-fluorene)-alt-2,7-(9,9-dioctyl-fluorene)] (hereinafter, referred to as PFN), Bathocuproine (hereinafter referred to as BCP), zirconium oxide (ZrO), zinc oxide (ZnO), or polyethynimine. After drying in nitrogen at room temperature, drying is performed on a hot plate at 130° C. in the atmosphere with a humidity of 40% to produce a titanium oxide layer 74 doped with Nb.

This transparent electrode is immersed in 3% salt water, and a potential is applied at +0.5 V (silver-silver chloride electrode) for 10 minutes. When the sheet resistance after water washing is measured, the increase in resistance is 5% or less.

Example 6

Figure 6:
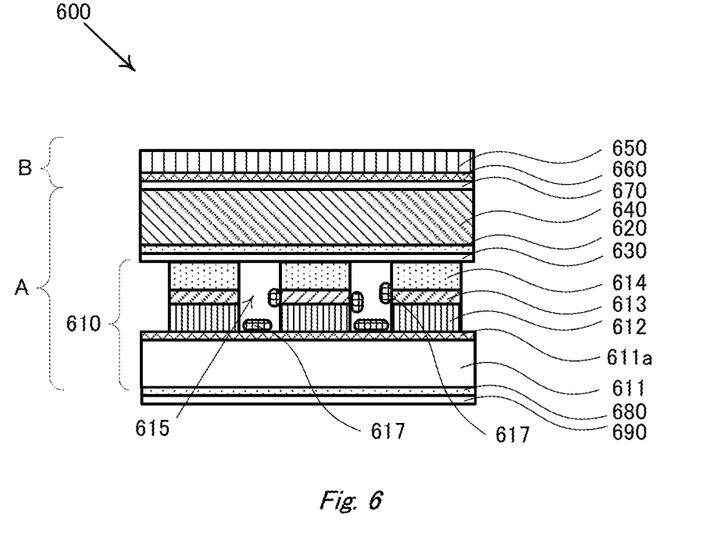
FIG. 6 is a conceptual view showing a structure of a photoelectric conversion element (solar battery cell) of Example 6.

A solar battery cell 60 illustrated in FIG. 6 is produced.

A laminate including an a-ITO layer 612, an alloy layer 613, and an a-ITO layer 614 is formed by the same method as in Example 3 on a PET substrate 611 on which a copper grid 611a having a square lattice shape and a line width of 50 µm is formed. Then, the separation region 615 is formed by scribing, and further exposed to hydrogen sulfide to form the trapping material 617, thereby forming the transparent electrode 610. In scribing, the scribing is performed by adjusting the strength so that the copper grid is not removed.

An aqueous solution of lithium fluoride is applied thereon to form an electron injection layer 620. Then, a toluene solution of C60-PCBM is applied with a bar coater and dried to form an electron transport layer 630. A chlorobenzene solution including poly(3-hexylthiophene-2,5-diyl) and C60-PCBM is applied with a bar coater and dried at 100° C. for 20 minutes to form a photoelectric conversion layer 640. Thus, a laminate A is formed.

There is prepared a stainless foil 650 having an insulating ceramic layer (not illustrated) formed on one surface. The surface of the plane on which no insulating ceramic layer is formed is treated with dilute hydrochloric acid to remove the surface oxide film, and then an aqueous solution of graphene oxide is applied with a bar coater to form a graphene oxide-containing layer. Then, after drying at 90° C. for 20 minutes, the graphene oxide containing layer is treated with hydrated hydrazine vapor at 110° C. for 1 hour to change to an N-graphene containing layer (barrier layer) 660 including a bilayer N-graphene layer in which a part of carbon atoms of the graphene oxide is substituted with nitrogen atoms.

An aqueous solution of PEDOT/PSS containing sorbitol is applied onto the N-graphene-containing layer 660 with a bar coater, and dried at 100° C. for 30 minutes to form a layer 670 (50 nm thick) including PEDOT/PSS. This PEDOT/PSS layer functions as an adhesive layer and a hole injection layer. Thus, a laminate B is formed.

The photoelectric conversion layer 640 of the laminate A and the PEDOT/PSS layer 670 of the laminate B are bonded at 90° C. to be connected each other.

The ultraviolet cutting ink containing 2-hydroxy-4-methoxybenzophenone is screen-printed on the back surface of the laminate A to form an ultraviolet cutting layer 680. A silica film is formed on the ultraviolet cutting layer by a vacuum vapor deposition method to form a gas barrier layer 690, thereby forming a solar battery cell 600.

The obtained solar battery cell exhibits an energy conversion efficiency of 5% or more with respect to 1 SUN of sunlight, and although left outdoors for one month, the efficiency degradation is less than 2%.

Comparative Example 3

A solar battery cell is produced in the same manner as in Example 6, except that the transparent electrode is not scribed. The obtained solar battery cell exhibits an energy conversion efficiency of 5% or more with respect to 1 SUN of sunlight, and when left outdoors for one month, the efficiency degradation is 20% or more.

Example 7

An organic EL element is produced. A laminate including an a-ITO layer, an alloy layer 613, and an a-ITO layer is formed in the same manner as in Example 3 on a PET substrate on which a copper grid having a square lattice shape and a line width of 50 μm is formed Then, a separation region is formed by scribing, and further exposed to hydrogen sulfide to form a transparent electrode. In scribing, the scribing is performed by adjusting the strength so that the copper grid is not removed. An aqueous solution of lithium fluoride is applied thereon as an electron transport layer, and tris(8-hydroxyquinoline)aluminum (Alq$_3$) (40 nm), which also functions as an n-type semiconductor and is a light emitting layer, is vapor-deposited to form a photoelectric conversion layer. N,N'-di-1-naphthyl-N,N'-diphenyl-1,1'-biphenyl-4,4'-diamine (hereinafter, referred to as NPD) is vapor-deposited thereon in a thickness of 30 nm to form a hole transport layer. A gold electrode is formed thereon by a sputtering method. An organic EL element is formed by further sealing the periphery of the formed element. The obtained organic EL element has little deterioration in output light, and the reduction in output is 5% or less regardless of continuous operation for 1000 hours.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

REFERENCE SIGNS LIST

100 Transparent electrode
101 transparent substrate
102 first transparent conductive oxide layer
103 metal layer
104 second transparent conductive oxide layer
105 separation region
106 conductive region
107 trapping material
200 solar battery cell
201 transparent substrate
202 first transparent conductive oxide layer
203 metal layer
204 second transparent conductive oxide layer
205 separation region
206 laminate
206a conductive region
207 high resistance region
300 solar battery cell
310 transparent electrode
311 transparent substrate
312 first transparent conductive oxide layer
313 metal layer
314 second transparent conductive oxide layer
315 separation region
317 trapping material
320 photoelectric conversion layer
330 counter electrode
400 organic el element
410 transparent electrode
411 transparent substrate
412 first transparent conductive oxide layer
413 metal layer
414 second transparent conductive oxide layer
415 separation region
417 trapping material
420 photoelectric conversion layer (light emitting layer)
430 counter electrode
500 transparent electrode
501 PET film
502 a-ITO
503 alloy of silver and Pd
504 a-ITO
505 N-graphene containing layer
507 trapping material
600 solar battery cell
610 transparent electrode
611 PET substrate
611a copper grid
612 a-ITO layer 613 alloy layer
614 a-ITO layer
615 separation region
617 trapping material
620 photoelectric conversion layer
650 stainless foil
660 N-graphene layer
670 layer including PEDOT/PSS
680 ultraviolet cutting layer
690 gas barrier layer

The invention claimed is:

1. A transparent electrode, comprising:
a transparent substrate; and
a plurality of conductive regions disposed on a surface of said transparent substrate and separated from each other by a separation region, wherein
a conductive region of the plurality of conductive regions has a structure in which a first transparent conductive metal oxide layer, a metal layer, and a second transparent conductive metal oxide layer are laminated in this order from said transparent substrate side, and
in the separation region, there is disposed a trapping material that traps any one or more of halogen, sulfur, or oxygen,
wherein said trapping material comprises metallic silver and silver halide or a sulfur compound of silver.

2. The transparent electrode according to claim 1, wherein said sulfur compound is a reactant of silver and an alkyl thiol or silver sulfide.

3. The transparent electrode according to claim 1, wherein said trapping material has a particulate structure.

4. The transparent electrode according to claim 1, wherein said trapping material is an insulating inorganic material.

5. The transparent electrode according to claim 1, wherein a transparent conductive oxide in said first transparent conductive metal oxide and said second transparent conductive metal oxide is indium-doped tin oxide, fluorine-doped tin oxide, aluminum-doped zinc oxide, or indium-doped zinc oxide.

6. The transparent electrode according to claim 1, wherein said metal layer comprises silver, copper, gold, stainless steel, titanium, nickel, chromium, tungsten, molybdenum, tin, zinc, or an alloy thereof.

7. The transparent electrode according to claim 1, wherein said separation region is filled with a material comprising a p-type inorganic oxide, an n-type inorganic oxide, a p-type organic compound, or an n-type organic compound.

8. The transparent electrode according to claim 1, further comprising a graphene-containing layer on said second transparent metal oxide layer.

9. The transparent electrode according to a claim 1, comprising a plurality of separation regions having different structures.

10. The transparent electrode according to claim 1, comprising a conductive region surrounded by said separation region.

11. An electronic device, comprising a structure in which the transparent electrode according to claim 1, an active layer, and a counter electrode are laminated in this order.

12. The electronic device according to claim 11, wherein said active layer is a photoelectric conversion layer.

13. The electronic device according to claim 12, wherein said active layer comprises a halogen ion or a sulfur compound.

14. The electronic device according to claim 11, wherein said counter electrode is transparent.

15. A transparent electrode, comprising:
a transparent substrate; and
a plurality of conductive regions disposed on a surface of said transparent substrate and separated from each other by a separation region, wherein
a conductive region of the plurality of conductive regions has a structure in which a first transparent conductive metal oxide layer are laminated in this order from said transparent substrate side, and
in the separation region, there is disposed a trapping material that traps any one or more of halogen, sulfur, or oxygen,
wherein said separation region is filled with a material comprising a p-type inorganic oxide, an n-type inorganic oxide, a p-type organic compound, or an n-type organic compound.

16. The transparent electrode according to claim 15, wherein said trapping material comprises metallic silver and silver halide or a sulfur compound of silver.

17. The transparent electrode according to claim 16, wherein said sulfur compound is a reactant of silver and an alkyl thiol or silver sulfide.

18. An electronic device, comprising a structure in which the transparent electrode according to claim 15, and active layer, and a counter electrode are laminated in this order.

19. The electronic device according to claim 18, wherein said active layer is a photoelectric conversion layer.

* * * * *